(12) United States Patent
Lau

(10) Patent No.: US 11,279,608 B1
(45) Date of Patent: Mar. 22, 2022

(54) DISTRIBUTION CONTROL DEVICE AND DISTRIBUTION DEVICE

(71) Applicant: GUAVOLUTION LIMITED, Hong Kong (CN)

(72) Inventor: Yuk Hang Lau, Hong Kong (CN)

(73) Assignee: GUAVOLUTON LIMITED, Hong Kong (CN)

( * ) Notice: Subject to any disclaimer, the term of this patent is extended or adjusted under 35 U.S.C. 154(b) by 0 days.

(21) Appl. No.: 17/194,310

(22) Filed: Mar. 7, 2021

(51) Int. Cl.
*B67D 1/00* (2006.01)
*G01R 33/07* (2006.01)
*B67D 1/08* (2006.01)

(52) U.S. Cl.
CPC ......... *B67D 1/0085* (2013.01); *B67D 1/0884* (2013.01); *B67D 1/0888* (2013.01); *G01R 33/07* (2013.01)

(58) Field of Classification Search
CPC .. B67D 1/0085; B67D 1/0884; B67D 1/0888; G01R 33/07
See application file for complete search history.

(56) References Cited

U.S. PATENT DOCUMENTS

| | | | | |
|---|---|---|---|---|
| 4,188,864 | A * | 2/1980 | Fischer | A47J 31/0573 |
| | | | | 219/433 |
| 9,468,222 | B2 * | 10/2016 | Stewart | A47J 31/002 |
| 10,866,599 | B2 * | 12/2020 | Zhang | G05D 9/00 |
| 2004/0221724 | A1 * | 11/2004 | Lowe | A47J 31/0605 |
| | | | | 99/299 |
| 2009/0095165 | A1 * | 4/2009 | Nosler | A47J 31/20 |
| | | | | 99/289 R |
| 2012/0164295 | A1 * | 6/2012 | Hansen | A47J 31/4403 |
| | | | | 426/474 |
| 2013/0074456 | A1 * | 3/2013 | Hradisky | B65B 39/06 |
| | | | | 53/473 |

(Continued)

FOREIGN PATENT DOCUMENTS

| | | |
|---|---|---|
| CN | 103090636 A | 5/2013 |
| CN | 105902170 A | 8/2016 |

OTHER PUBLICATIONS

International Search Report issued in corresponding International application No. PCT/CN2018/104557, dated Dec. 18, 2018.

(Continued)

*Primary Examiner* — Donnell A Long

(57) ABSTRACT

A distribution control device includes a rotation sensing assembly and a logic control circuit. The rotation sensing assembly is communicated with the logic control circuit. The logic control circuit is communicated with a distribution equipment. The rotation sensing assembly is detachably fix and match with a container and synchronously rotates with the container. The rotation sensing assembly detects and sends rotation information to the logic control circuit according to rotation of the container from a starting position. The logic control circuit sends a feeding control instruction to the distribution equipment according to the rotation information and a preset corresponding relationship. When it is detected that the container returns to the starting position, a halt instruction is sent to the distribution equipment. The container is detachably communicated with the rotation sensing assembly to drive the rotation sensing assembly to rotate synchronously.

15 Claims, 8 Drawing Sheets

(56) References Cited

U.S. PATENT DOCUMENTS

| | | | |
|---|---|---|---|
| 2013/0095218 A1* | 4/2013 | de Graaff | A23F 5/26 |
| | | | 426/433 |
| 2014/0314913 A1* | 10/2014 | Stewart | A47J 31/002 |
| | | | 426/78 |
| 2015/0164265 A1 | 6/2015 | Cheng | |
| 2015/0257577 A1* | 9/2015 | Liu | A47J 31/0626 |
| | | | 99/298 |
| 2015/0315005 A1* | 11/2015 | Corbelli | B67D 1/0801 |
| | | | 222/95 |
| 2016/0095462 A1 | 4/2016 | Bikerman et al. | |
| 2021/0002117 A1* | 1/2021 | Park | B67D 1/0859 |
| 2021/0002119 A1* | 1/2021 | Kim | B05B 15/68 |

OTHER PUBLICATIONS

Written Opinion of the International Search Authority in corresponding International application No. PCT/CN2018/104557.

\* cited by examiner

111

Current output signal

US 11,279,608 B1

DISTRIBUTION CONTROL DEVICE AND DISTRIBUTION DEVICE

FIELD OF THE INVENTION

The invention relates to the field of distribution technology, in particular to distribution control device and distribution device.

BACKGROUND OF THE INVENTION

At present, distribution instrument and equipment are used by most restaurants and cafes to sell drinks, desserts, etc.

Traditional distribution equipment, dispenser, etc. must be operated through touch control board (such as specific buttons or touch screens), especially in public places where the operating interfaces that must be touched by many users are easy to cause bacteria transmission giving rise to hygiene problems.

SUMMARY OF THE INVENTION

Therefore, it is necessary to provide a distribution control device and distribution equipment that is able to improve hygiene and does not require operation by touching the same control board.

The invention relates to a distribution control device, comprising a rotation sensing assembly and a logic control circuit. The rotation sensing assembly is communicated with the logic control circuit, which is used to communicate with the distribution equipment. The rotation sensing assembly is used for detachably and fixedly matching containers and synchronously rotating with the containers.

The rotation sensing assembly is used for obtaining and sending the rotation information detected by the rotation of the container from the starting position to the logic control circuit.

The logic control circuit is used for receiving the rotation information, and sending a feeding control instruction to the distribution equipment according to the rotation information and a preset corresponding relationship. The feeding control instruction is used for controlling the distribution equipment to transfer materials, and sending a halt instruction to the distribution device when the container is detected to be rotated back to the starting position according to the rotation information. The halt instruction is used for controlling the distribution equipment to stop conveying materials, wherein the preset corresponding relationship is the corresponding relationship between the rotation information and the feeding control instruction.

A distribution device comprising a distribution device and a distribution control device that is communicated with the distribution equipment.

The distribution device is used for receiving a feeding control instruction, extracting materials according to the feeding control instruction and transmitting, receiving a halt instruction, and stopping extracting materials according to the halt instruction.

The rotation sensing assembly in the distribution control device and distribution device is used for obtaining rotation information according to the rotation detection of the container from the starting position and transmitting the rotation information to the logic control circuit. The logic control circuit is used for receiving the rotation information, and sending a feeding control instruction to the distribution equipment according to the rotation information and a preset corresponding relationship. The feeding control instruction is used for controlling the distribution equipment to transfer materials, and sending a halt instruction to the distribution device when the container is detected to be rotated back to the starting position according to the rotation information. The halt instruction is used for controlling the distribution equipment to stop conveying materials, wherein the preset corresponding relationship is the corresponding relationship between the rotation information and the feeding control instruction. The container can be detachably communicated with the rotation sensing assembly to drive the rotation sensing assembly to rotate synchronously, Users do not need to touch the surface of the shared control board, but only need to touch and rotate personal containers to achieve the functional operation of distribution, thus effectively improving hygiene.

DESCRIPTION OF THE DRAWINGS

In order to more clearly explain the technical scheme in the embodiments of the present invention, the drawings to be used in the description of the embodiments will be briefly described below. It is apparent that the drawings in the following description are only some embodiments of the present invention, from which other drawings may be obtained without creative effort by those of ordinary skill in the art.

DETAILED DESCRIPTION OF THE EMBODIMENTS

In order to clarify the purpose, technical scheme and advantages of the present invention, the present invention will be described in further detail below based on the accompanying drawings and embodiments. It should be understood that the specific embodiments described herein are intended to explain the invention only and are not intended to limit it.

Figure 1:
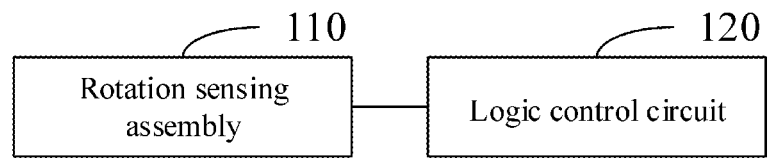
FIG. 1 is a structure diagram of a distribution control device in one embodiment.

In one embodiment, as shown in FIG. 1, a distribution control device comprises a rotation sensing assembly 110 and a logic control circuit 120. The rotation sensing assembly 110 is communicated with the logic control circuit 120, which is used for communicating the distribution equipment. The rotation sensing assembly 110 is used for detachably and fixedly matching the container and synchronously rotating with the container, and the rotation sensing assembly 110 is used for obtaining rotation information according to the rotation detection of the container from the starting position and sending the rotation information to the logic control circuit 120. The logic control circuit 120 is used for receiving the rotation information, sending a feeding control instruction to the distribution equipment according to the rotation information and the preset corresponding relationship, and the feeding control instruction is used for controlling the distribution equipment to transfer materials, and sending a halt instruction to the distribution equipment when the container is detected to be rotated back to the starting position according to the rotation information. The halt instruction is used for controlling the distribution equipment to stop conveying materials, wherein the preset corresponding relationship is the corresponding relationship between the rotation information and the feeding control instruction.

Figure 2:
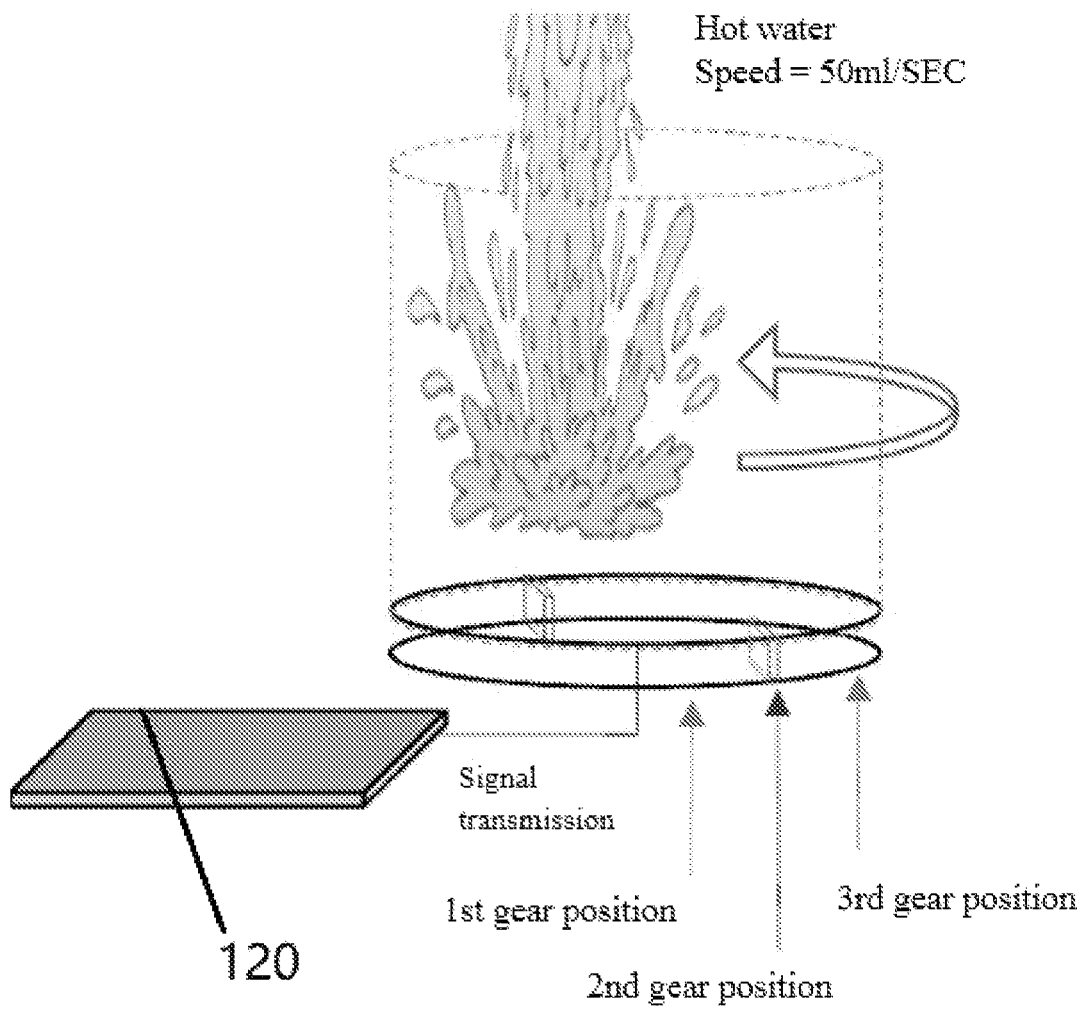
FIG. 2 is a schematic diagram of a distribution control device executing a distribution instruction after sensing a rotation signal in one embodiment.
Figure 3:
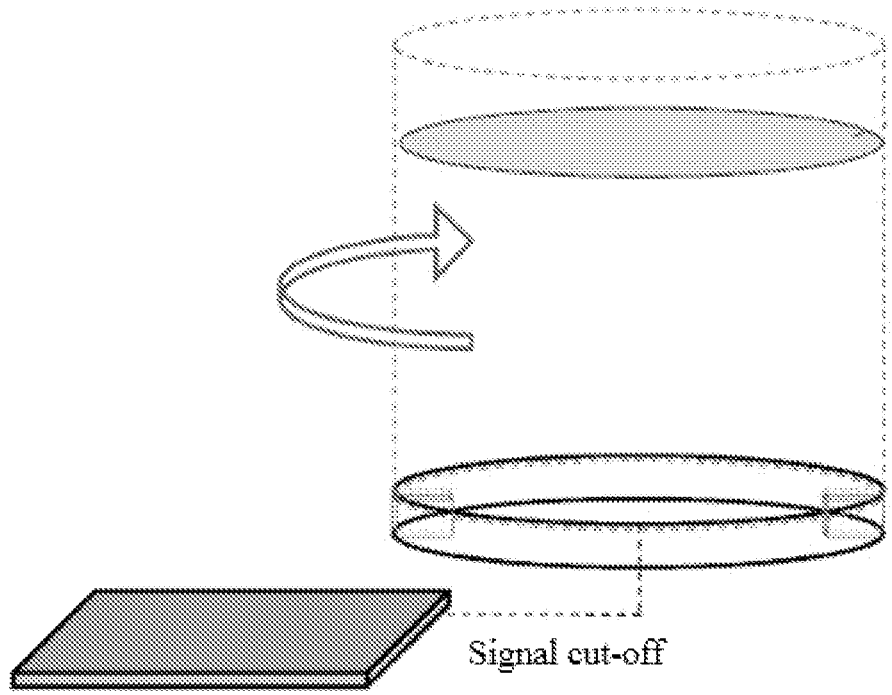
FIG. 3 is a schematic diagram of showing the distribution control device in one embodiment after the distribution control device senses the rotation signal and completes the distribution instruction.

Specifically, the logic control circuit 120 is a logic manipulation circuit. The distribution equipment is manipulated according to the rotation information detected by the rotation sensing assembly. A corresponding relationship between the rotation information and the feeding control instruction is set in advance in the logic control circuit 120. The rotation information may be varied and not limited, which can be set as actually required, such as distribution speed. Preset correspondence refers to material category selection, allocation capacity, speed, etc. corresponding to rotation information. The user first defines the allocated material category and the execution specifications of the capacity, quantity and speed by presetting the corresponding rotation information. The specific types of materials are not limited, and may be liquids such as water and beverages, semi-liquids such as ice cream, or solids such as ice cubes, so that the logic control circuit 120 is able to execute preset operation instructions according to preset conditions. For example, as shown in FIG. 2, when rotating to the second gear position, the distribution speed is 50 mL, per second. The user places the container in the mating rotation sensing assembly 110. The bottom of the container is removable communicated with the rotation sensing assembly 110, allowing the rotation sensing assembly 110 to be rotated by the container. For example, when the rotation sensing assembly 110 follows the container to rotate to the second gear, the logic control circuit 120 obtains the corresponding signal of the rotation sensing assembly 110, and the distribution speed is 50 mL per second according to the preset conditions of the user. As shown in FIG. 3, when the user turns the container back to the starting position, the rotation sensing assembly 110 is also turned back to the starting position, and the distribution execution is stopped.

In view of the increasing awareness of hygiene in the society and in order to greatly reduce the spread of bacteria, when sharing certain distribution equipment and dispensers in public places, users do not need to touch any surface that other users will touch on the distribution control device. Users only need to touch their own containers by hand and rotate the containers by hand to operate the distribution action. Its advantages lie in hygiene: the spread of bacteria and viruses caused by individual users' need to touch the same designated control board is greatly reduced, so as to improve the hygiene environment of the group society, ensure the hygiene condition of individual distribution equipment and dispensers so that users are able to use them at ease. Commercial aspects: in commercial occasions (e.g. Self-service water intake service and self-service beverage extraction service in restaurants, etc.), customers are able to use them at ease due to hygiene and have a better hygiene image.

In one embodiment, the rotation information comprises a rotation direction and/or a rotation amplitude, and the feeding control instruction comprises a material temperature control instruction and/or a dispensing speed control instruction; The logic control circuit 120 is used for sending a material temperature control instruction to the distribution equipment according to the rotation direction and the preset corresponding relationship, and/or sending a dispensing speed control instruction to the distribution equipment according to the rotation amplitude and the preset corresponding relationship.

Specifically, in the present embodiment, the rotation information comprises the rotation direction and the rotation amplitude. The direction of rotation is the direction of rotation relative to the starting position. For example, if rotate counterclockwise with respect to that starting position, or clockwise with respect to the starting position, the rotation amplitude refers to the rotation gear, such as 1st gear, 2nd gear, 3rd gear, etc. The rotation direction is defined to control the material temperature, such as clockwise rotation to distribute normal temperature water, counterclockwise rotation to distribute hot water, and the rotation amplitude controls the distribution speed, such as 50 mL per second for 1st gear and 80 mL per second for 2nd gear. It is understood that users are able to set the preset corresponding relationship according to actual requirements.

In one embodiment, the removable communication comprises at least one of the snap-on communication, clamping communication, and adsorption communication.

Specifically, removable communication comprises, but are not limited to, snap-on communication, clamping communication, and adsorption communication, and removable communication which enables the rotation sensing assembly 110 to rotate synchronously with the container is applicable. In this way, the user only needs to detachably communicate the container to the rotation sensing assembly 110 to drive the rotation sensing assembly 110 to rotate, and the container can be conveniently taken away after triggering the distribution equipment to perform the distribution action, thus further facilitating operation.

In one embodiment, grooves are provided on the inner surface of the rotation sensing assembly 110, and projections are provided on the outer surface of the container to correspond to positions; Or protrusions are provided on the inner surface of the rotation sensing assembly 110, and grooves are provided at corresponding positions on the outer surface of the container; Or protrusions and grooves are provided on the inner surface of the rotation sensing assembly 110, and grooves and protrusions are provided on the outer surface of the container to correspond to the position.

Figure 4:
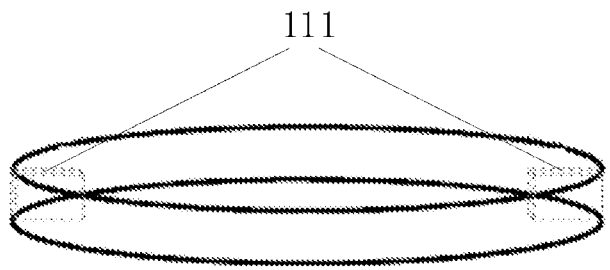
FIG. 4 is a schematic diagram of a partial structure of a rotation sensing assembly in one embodiment.
Figure 5:
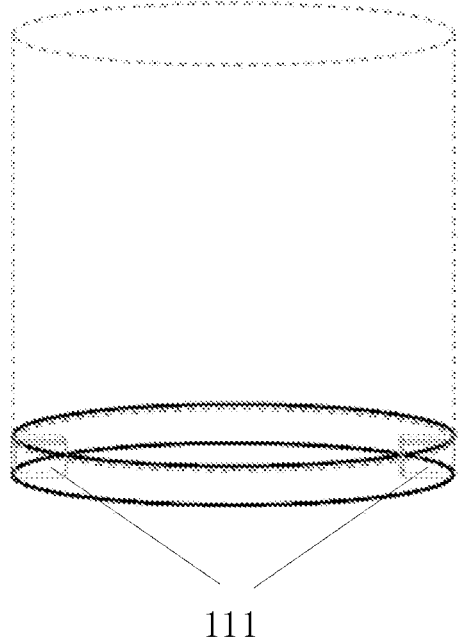
FIG. 5 is a schematic diagram of a container in conjunction with a rotation sensing assembly to follow the synchronous rotation in one embodiment.

Specifically, the convex position may be provided at the bottom or side of the container, the concave position may be provided at the bottom or side of the container, and the rotation sensing assembly 110 may be provided at the bottom corresponding to the convex position at the bottom of the container with a concave position for matching and allowing self-reaction to identify the desired material type, dispensed capacity, quantity and speed. Similarly, the rotation sensing assembly 110 is provided at the bottom corresponding to the recesses at the bottom of the container with a convex position to serve as matching and allowing self-reaction to identify the desired material type, dispensed capacity, quantity and speed. The rotation sensing assembly 110 is provided at the side corresponding to the recesses at the side of the container with a convex position for matching and allowing self-reaction to identify the desired material type, dispensed capacity, quantity and speed. The rotation sensing assembly 110 is provided on the side corresponding to the convex position on the side of the container with a concave position for matching and allowing self-reaction to identify the desired material type, the dispensed capacity, quantity and speed. As shown in FIG. 4 and FIG. 5, the rotating assembly 111 of the rotation sensing assembly 110 accommodates the convex position (or concave position) at the bottom (or side) of the container, allows it to rotate, and transmits a signal to the logic control circuit 120 during the rotating operation, thus controlling the distribution equipment to perform the corresponding dispensing operation. Furthermore, the rotating assembly 111 comprises the convex position (or concave position) provided at the bottom (or side) of the rotating sensing assembly 110. For example, the user places the container in the matched rotation sensing assembly 110 so that the convex position at the bottom of the container is fixed with the concave position of the rotation sensing assembly 110, the rotation sensing assembly 110 rotates synchronously with the container, and is set to rotate counterclockwise to distribute hot water, and the distribution speed is 50 mL per second when rotating to the second gear position. Furthermore, the container may be a special or ordinary one. When the container is an ordinary one, the device matching the rotation sensing assembly 110 can be detachably fixed at the corresponding position of the ordinary container to allow the rotation sensing assembly 110 to rotate synchronously with the container.

Furthermore, the matching positions, shape and quantity of the concave and convex parts of the container listed above, as well as the matching position, shape and quantity of the concave and convex portions of the rotation sensing assembly 110, are not limited to the examples cited in the description. Whether each matching position is concave or convex, the matching quantity of the concave and convex portions relative to the matching amount, the position of the concave and convex portions in the container and the rotation sensing assembly 110, and the shape of the concave and convex portions can all be defined according to the requirements of the actual design application environment.

Figure 6:
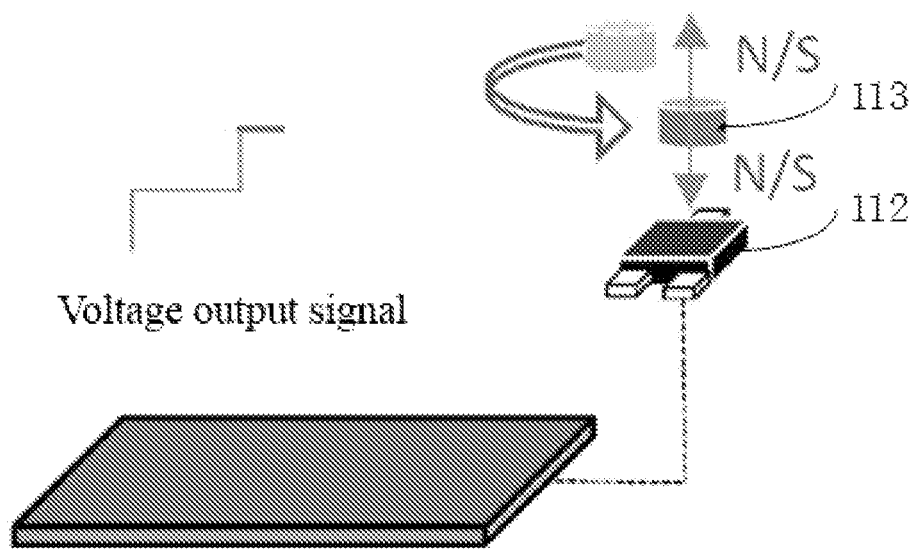
FIG. 6 is a schematic diagram of the operation principle of the rotation sensing assembly in one embodiment.

In one embodiment, as shown in FIG. 6, the rotation sensing assembly 110 comprises a tray, a magnetic induction switch integrated circuit 112 and a magnet 113. The tray is used for detachably fixing the container, the magnet 113 is arranged on the tray, the tray and the magnet 113 rotate synchronously with the container, the magnetic induction switch integrated circuit 112 is communicated with the logic control circuit 120, and the magnetic induction switch integrated circuit 112 is used for generating and transmitting the rotation information to the logic control circuit 120 according to the magnetic force change induced when the magnet 113 rotates.

Specifically, the tray and the magnet rotate synchronously with the container. As that magnet is rotated to an electronic component close to the magnetic induction switch integrated circuit, the output of the magnetic induction switch integrated circuit element will generate voltage changes and convert them into rotation information when the magnetic force of the magnet is enhanced until the magnetic induction switch integrated circuit element senses sufficient magnetic force, so that the logic control circuit is able to distinguish the state changes, and thereby control the distribution equipment to perform corresponding operations according to the received rotation information.

Figure 7:
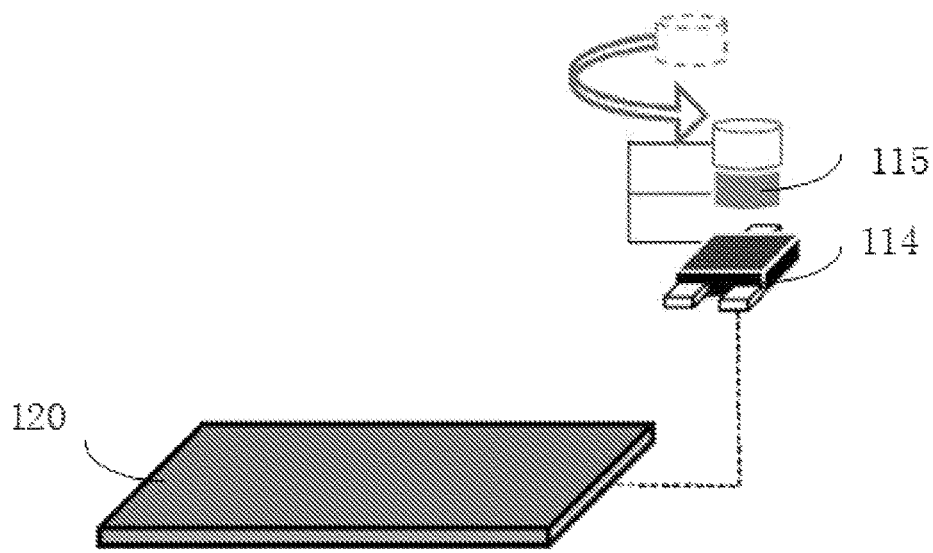
FIG. 7 is a schematic diagram of the operation principle of the rotation sensing assembly in another embodiment.

In one embodiment, as shown in FIG. 7, the rotation sensing assembly 110 comprises a tray, a current sensing integrated circuit 114 and a conductive assembly 115. The tray is used for detachably fixing the container, the conductive assembly 115 is arranged on the tray, the tray and the conductive assembly 115 rotate synchronously with the container, and the current sensing integrated circuit 114 is communicated with the logic control circuit 120, and the current sensing integrated circuit 114 is used for generating and transmitting the rotation information to the logic control circuit 120 according to the current change detected when the conductive assembly 115 rotates.

Specifically, the tray and the conductive assembly rotate synchronously with the container and contact after touching the rotating conductive assembly (the conductive part is contacted when the container is rotated). When the current is turned to the designated position part and the current is turned on, the current sensing integrated circuit will convert the current into rotation information due to the change of the current, so that the logic control circuit is able to distinguish the change of the state, and thus control the distribution equipment to execute the corresponding operation according to the received rotation information.

Figure 8:
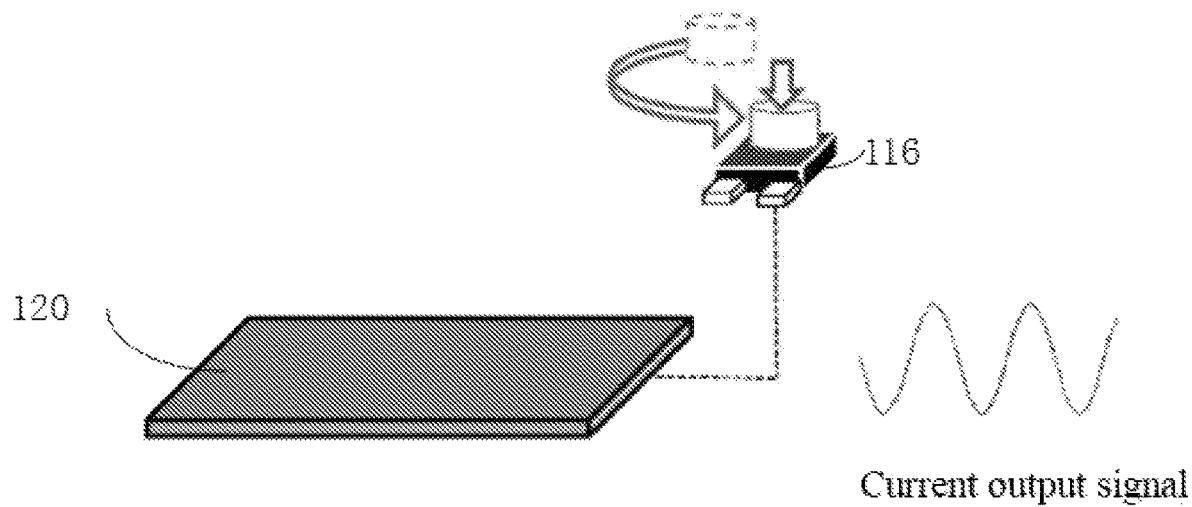
FIG. 8 is a schematic diagram of that operation of a rotation sensing assembly in another embodiment.

In one embodiment, as shown in FIG. 8, the rotation sensing assembly 110 comprises a tray, a pressure-driven component, and a piezoelectric induction integrated circuit 116. The tray is used to detachably fix the pressure-driven component, and the pressure-driven component is arranged on the tray. The conductive component rotates synchronously with the container. The piezoelectric induction integrated circuit 116 is communicated with the logic control circuit 120. The piezoelectric induction integrated circuit is used to generate and send corresponding rotation information to the logic control circuit 120 according to the voltage or current changes induced when the pressure-driven component rotates.

Specifically, the rotation sensing assembly rotates synchronously with the container, and when the pressure-driven component (that is, the component of the piezoelectric sensing circuit, the conductive part that is pressed down when the container is rotated) is rotated to the specified position, it is pressed to the piezoelectric when pressure is applied by the sensing circuit, the piezoelectric sensing integrated circuit will generate a certain output (voltage/current) change due to the applied pressure and convert it into rotation information, allowing the logic control circuit to distinguish the state change, and then according to the received the rotation information controls the distribution equipment to perform the corresponding operation.

In one embodiment, the rotation sensing assembly 110 comprises a tray, a rotating component and a circuit switch. The tray is used to detachably fix the container. The rotating component is arranged on the tray. The tray and the rotating component rotate synchronously with the container. The circuit switch is communicated with the logic control circuit 120. The circuit switch is used to generate and send corresponding rotation information to the logic control circuit 120 according to the change of the switch state of the circuit when the rotating component rotates.

Specifically, the rotation sensing assembly 110 rotates synchronously with the container. When the rotating component is rotated to a specified position, the trigger circuit changes the state of the switch, and converts the change of the circuit switch into rotation information, so that the logic control circuit 120 is able to distinguish the state change, thereby controlling the distribution equipment to perform corresponding operations according to the received rotation information.

In one embodiment, the rotation sensing assembly 110 can be a tray, a conductive component, and a general circuit. The conductive component is able to follow the rotation of the container and contact to cause the circuit to be turned on. When it is rotated to the designated position and the circuit is communicated with the circuit, the circuit is turned on. Let the logic control circuit 120 distinguish the state change, and control the distribution equipment to perform the corresponding operation according to the received rotation information.

The electronic induction methods exemplified above are not limited to the examples given. In particular, there are many electronic induction methods, thus the invention can be implemented by other electronic induction methods.

Figure 9:
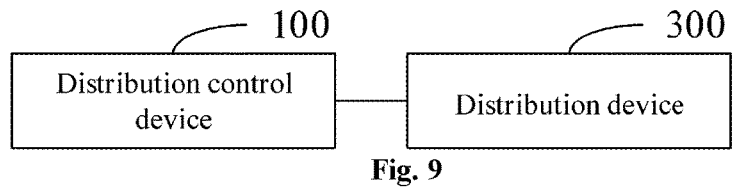
FIG. 9 is a structure diagram of distribution device in one embodiment.

In one embodiment, as shown in FIG. 9, distribution device comprises distribution equipment 300 and the above distribution control device 100. The distribution control device 100 is communicated with the distribution equipment 300. The distribution equipment 300 is used to receive feeding control instructions according to the feeding control instruction to extract and transfer materials, and receive the halt instruction to stop extracting materials according to the halt instruction.

Specifically, the distribution equipment 300 is used to extract and transfer the corresponding materials to the container according to the feeding control instruction sent by the distribution control device 100, and stop extracting and transferring the corresponding materials to the container according to the halt instruction sent by the distribution control device 100 to complete the material distribution process through joint efforts.

Figure 10:
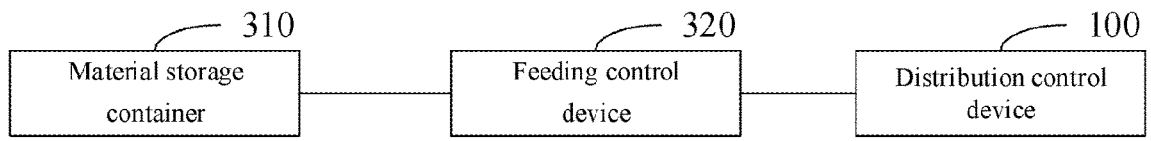
FIG. 10 is a structure diagram of distribution device in another embodiment.

In one embodiment, as shown in FIG. 10, the distribution equipment 300 comprises a material storage container 310 and a feeding control device 320. The material storage container 310 is communicated with the feeding control device 320, and the feeding control device 320 is communicated with the distribution control device 100. The feeding control device 320 is used for receiving a feeding control instruction, extracting and transferring materials from the material storage container 310 according to the feeding control instruction; and receiving a halt instruction, and stopping extracting materials according to the halt instruction.

Specifically, the material storage container 310 is a liquid, semi-liquid, or solid storage container. The distribution equipment may include multiple material storage containers 310. Each material storage container 310 matches the corresponding feeding control device 320, which can be combined and matched as necessary. For example, it comprises a semi-liquid and a solid storage container. The specific type of material is not limited. It can be liquids such as water and beverages, or semi-liquid such as ice cream, smoothie drinks, and soft ice cream, or ice cubes, sugar granules and other solids.

Figure 11:
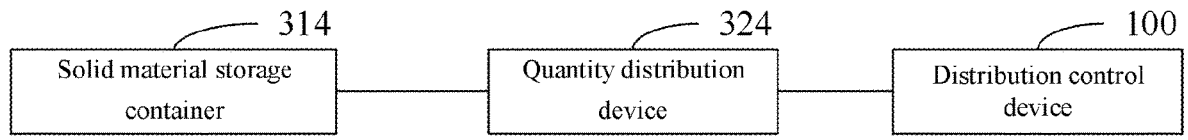
FIG. 11 is a structure diagram of distribution device in another embodiment.
Figure 12:
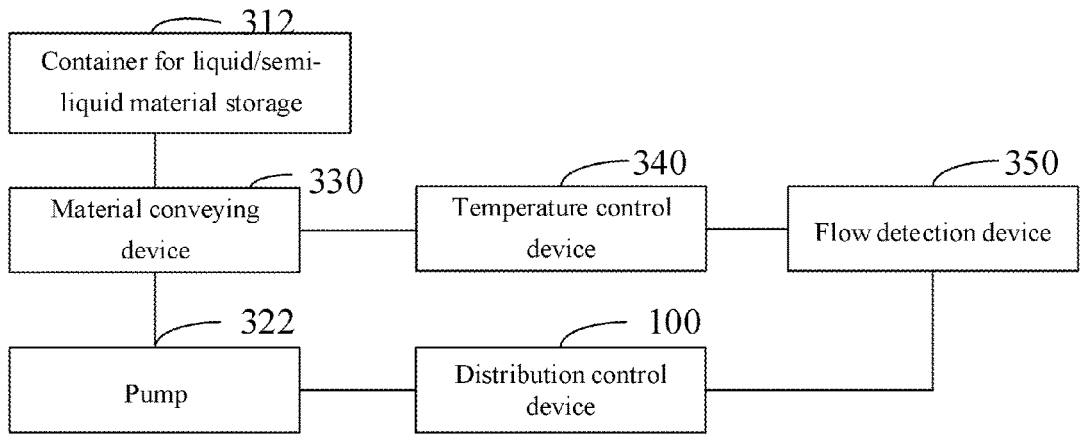
FIG. 12 is a structure diagram of distribution device in another embodiment.
Figure 13:
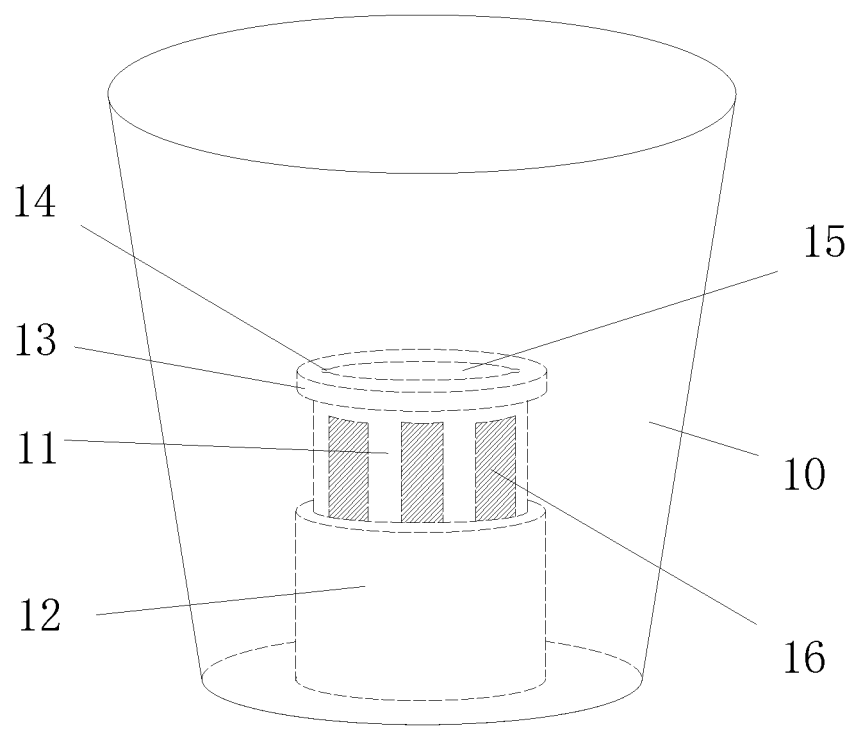
FIG. 13 is a schematic diagram of an upper body structure of a material conveying device in one embodiment.

In one embodiment, as shown in FIG. 11 and FIG. 12, the feeding control device 320 comprises a pump 322 and/or quantity distribution equipment 324. When the feeding control device 320 comprises a pump 322 and quantity distribution equipment 324, the material storage container 310 comprises a liquid/Semi-liquid material storage container 312 and solid material storage container 314, the distribution equipment also comprises a material conveying device 330, the liquid/semi-liquid material storage container 312 is communicated with the pump 322 through the material conveying device 330, and the solid material storage container 314 is communicated with the quantity distribution equipment 324. The pump 322 and the quantity distribution equipment 324 are communicated with the distribution control device; when the feeding control device 320 is a pump 322, the material storage container 310 is a liquid/semi-liquid material storage container 312, and the distribution equipment also comprises a material conveying device 330. The liquid/semi-liquid material storage container 312 is communicated with the pump 322 through the material conveying device 330. The pump 322 is communicated with the distribution control device. When the feeding control device 320 is the quantity distribution equipment 324, the material storage container 310 is a solid material storage container 314, and the solid material storage container 314 is communicated with the distribution control device through the quantity distribution equipment 324.

Specifically, when the material is liquid or semi-liquid, the corresponding material storage container 310 is the liquid/semi-liquid material storage container 312, and the corresponding feeding control device 320 is the pump 322. When the material is solid, the corresponding material storage container 310 is a solid material storage container 314, and the corresponding feeding control device 320 is quantity distribution equipment 324. When the feeding control device 320 comprises a pump 322, it also comprises a material conveying device 330, and the pump 322 controls the material conveying device 330 to extract and convey the material from the material storage container 310.

Figure 14:
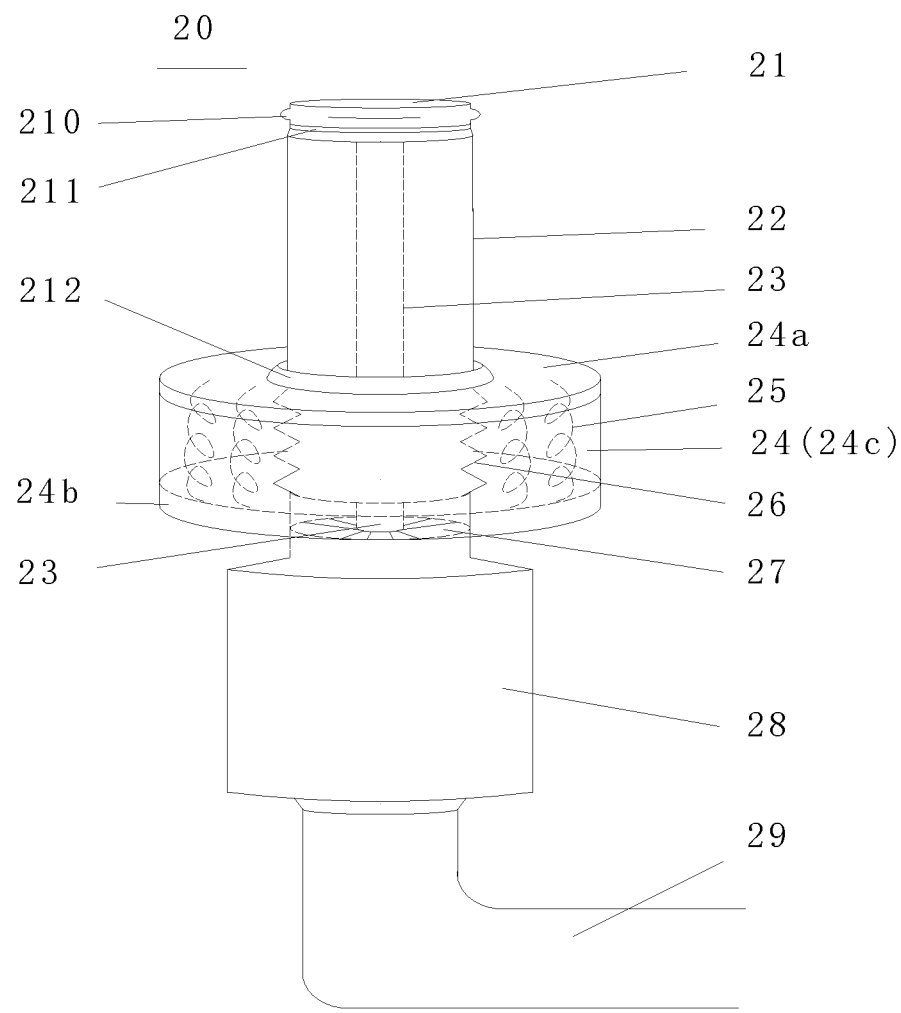
FIG. 14 is a schematic diagram of a lower body structure of a material conveying device in one embodiment.
Figure 15:
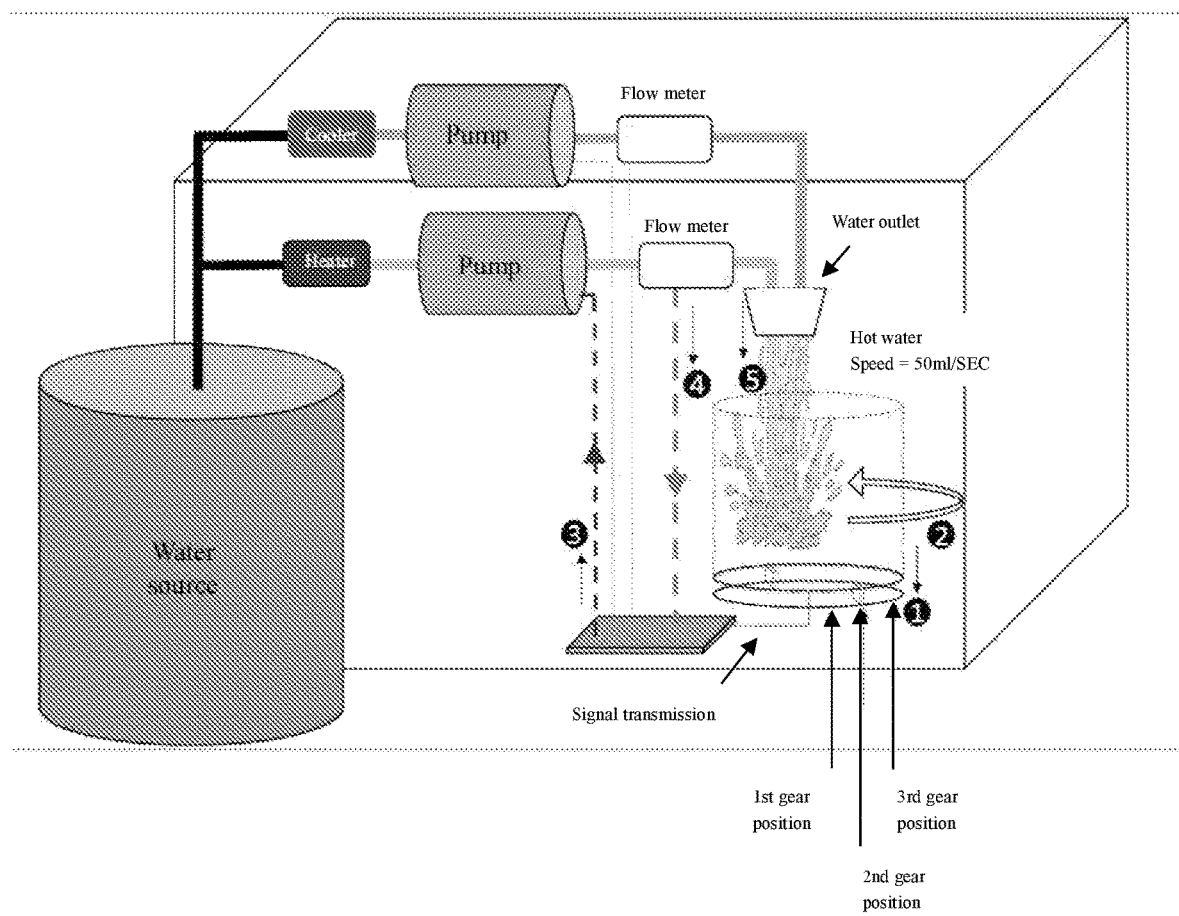
FIG. 15 is a structure diagram of distribution device in one embodiment.

In one embodiment, as shown in FIG. 14 and FIG. 15, the material conveying device 330 comprises an upper body (10), a lower body (20), and the upper body (10) comprises a fixing piece (12), a lifting piece (11), and a fixing piece (12) which are fixedly arranged on the inner bottom surface of the upper body (10). The lifting piece (11) is arranged inside the fixing piece (12) and is able to move up and down, and the side wall of the lifting piece (11) is provided with a circulation hole (16). The middle part of the lifting member (11) has a perfusion circulation channel (15), which passes through the bottom of the upper body (10); the lower body (20) comprises a cover plug (21), a rigid cylinder (22), and a cover plug (21) which are fixedly communicated with the rigid column (22), the rigid column (22) has a channel inside, and the outer side wall of the cover plug (21) can be engaged with the inner side wall of the lifting member (11).

Furthermore, the upper body 10 comprises a fixing part 12 and a lifting part 11, The fixing part 12 is fixedly arranged on the inner bottom surface of the upper body 10. The lifting part 11 is arranged inside the fixing part 12 and is able to move up and down. In this embodiment, the fixing part 12 and the lifting member 11 are in a circular ring shape, of course, it can also be arranged in other shapes; the side wall of the lifting member 11 is provided with a circulation hole 16 useful for pouring, and the middle of the lifting member 11 has a pouring flow channel 15 and a pouring flow channel 15 going through the bottom of the upper body 10.

The lower body 20 comprises a cover plug 21, a rigid cylinder 22, an outer ring telescopic tube 24, an inner ring telescopic tube 26, an internal passage 28, and a communicating hose 29. The outer ring telescopic tube 24 comprises a top plate 24a, a bottom plate 24b, and the side wall 24c used to communicate with them. The top plate 24a and the bottom plate 24b are provided with a spring 25, the top plate 24a and the bottom plate 24b are provided with a spring 25, the rigid column 22 is provided on the top plate 24a, and the rigid column 22 is made of strong materials to support it, such as stainless steel materials which are not easy to rust. The rigid cylinder 22 has a channel inside. The inner ring telescopic tube 26 is arranged inside the outer ring telescopic tube 24 and communicates with the rigid cylinder 22. The inner ring telescopic tube 26 is made of elastic materials, such as rubber materials, and the cost of rubber materials is low with good flexibility and long service life. The spring 25 is located outside the inner ring telescopic tube 26, and a second leak-proof ring 212 is provided at the joint between the rigid cylinder 22 and the top plate 24a. A support base 27 is provided on the bottom plate 24b, and a support column 23 is provided on the support base 27. The support column 23 passes through the inner ring telescopic tube 26 and extends into the rigid column 22. The top of the support column 23 is fixedly provided with a cover plug 21, The cover plug 21 is fixedly communicated with the top of the rigid cylinder 22. A first leak-proof ring 211 is provided at the junction of the cover plug 21 and the rigid cylinder 22. The rigid cylinder 22 is located inside the lifting member 11, and the outer side wall of the cover plug 21 is communicated with the inner side wall of the top of the lifting member 11 and is locked by the coordination of the locking position 14 and the convex position 210, In this embodiment, the locking position 14 is provided on the inner side wall of the top of the lifting member 11, and the convex position 210 is provided on the outer side wall of the cover plug 21. The internal channel 28 is fixedly communicated with the bottom plate 24b and communicates with the rigid cylinder 22, and the communicating hose 29 communicates with the bottom of the internal channel 28.

Specifically, when the material conveying device 330 is used, it is used in conjunction with the feeding control device 320 and presses the upper body downward. The fixing member moves down with the upper body, and the rigid cylinder drives the lifting member to move up through the cover plug, and the circulation hole is exposed. At this time, the liquid/semi-liquid is able to flow from the lower body to the upper body and be discharged from the circulation hole, thereby completing the operation of filling. The material conveying device 330 can be applied to the filling of various types of water, beverages, or other liquid/semi-liquid, ice cream machines and smoothies at fast speed with good efficiency and safety performance. For example, it is able to reduce the risk of burns by splashing during high temperature liquid transportation and the leakage and the foam generated by the carbonated liquid during the pouring from the lower net, thereby eliminating the need for liquid pouring action; equipped with a simple natural water flow principle, from the liquid supply source to the upper body in this design; the application of this design will update the traditional beverages, drinks and other liquids, and pouring semi-liquid materials from top to bottom is easy to operate.

In one embodiment, as shown in FIG. 12, when the feeding control device 320 is a pump 322, the distribution device further comprises a flow detection device 350, which is communicated with the distribution control device 100, and the flow detection device 350 is used to detect materials and send the flow to the distribution control device 100; the distribution control device 100 receives the flow, and when it detects that the flow is inconsistent with the preset flow, it sends a flow control instruction to the pump 322 until the flow rate feedback from the flow detection device 350 is consistent with the preset flow. The pump 322 is used to control the dispensing speed according to the received flow control instruction.

Specifically, the specific type of the flow detection device 350 is not limited, and the corresponding adjustment is made according to the type of material. The corresponding flow detection device 350 will feed back the flow of the logistics to the logic control circuit to ensure the correct distribution speed or quantity. The applicable scope of this invention comprises but is not limited to: various liquid distribution applications (such as drinking water, beverage capacity), various semi-liquid distribution applications (such as smoothie drinks, soft ice cream capacity) and various solids distribution application (such as the amount of ice cubes, sugar granules).

In one embodiment, as shown in FIG. 12, the distribution device further comprises a temperature control device 340, the material conveying device is communicated with the temperature control device 340, and the pump 322 receives the feeding control instruction, and extracts and conveys the materials from the material storage container according to the feeding control instruction, including the pump 322 that receives the feeding control instruction, and extracts the materials from the material storage container 310 according to the feeding control instruction, and sends them to the temperature control device 340; the temperature control device 340 controls the temperature of the received materials to a preset temperature before sending them.

Specifically, when the material is liquid or semi-liquid, the distribution device further comprises a temperature control device 340, which is used to control the temperature of the liquid or semi-liquid material. When the distribution device comprises the temperature control device 340, correspondingly, the control instructions include corresponding temperature control information; such as turning counterclockwise to dispense hot water, and turning clockwise to dispense normal temperature water. The pump 322 receives the feeding control instruction, and controls the material conveying device 330 from the material storage container 310 according to the feeding control instruction. The extracted materials are sent to a temperature control device 340; the temperature control device 340 controls the temperature of the received materials to a preset temperature before sending them.

In one embodiment, the temperature control device 340 comprises a heater and/or cooler, and the heater and/or cooler is communicated with the distribution control device 100 and the flow detection device 350 through the temperature control device 340.

Specifically; the heater is used to heat the materials, and the cooler is used to cool the materials to control the temperature of the materials.

The above examples of distribution materials outlets are not limited or specified, the amount of rotation gear, distribution speed, etc. are not limited to the examples in this description, and can be determined according to individual application requirements; this invention only uses the rotation gear as the distance. The sensing unit of rotation can be the amplitude of rotation.

In practice, as shown in FIG. 15, taking liquid/semi-liquid distribution as an example, the specific process is as follows: 1. the container is placed at the designated position of the distribution device, and the convex position at the bottom of the container is communicated with the relative concave position of the distribution device 2. The user rotates the container counterclockwise to the second gear position (counterclockwise is the distribution of hot water; the second gear position is the distribution speed=50 mL/SEC), and transmits the relative signal in the set induction mode (corresponding to the control Instruction) to the logic control circuit; 3. At this time, the logic control circuit is controlled according to the state signal of the container being rotated to start the water pump motor (corresponding to the feeding control device 220) that distributes hot water and control the distribution speed of the water pump motor (50 mL/SEC)); 4. When the designated water pump motor is started, the corresponding flow meter will feed back the water flow speed to the logic control circuit to ensure that the distribution speed is correct; 5. The water outlet of the distribution device will execute the designated distribution instruction (distribute hot water to 50 mL/SEC speed to distribute).

The above-mentioned distribution device can be applied to and is not limited to any kinds of liquids, beverages, or other liquid/semi-liquid/solid materials that can be distributed, especially suitable for public places (such as banks, offices, airports, exhibitions, and other shared spaces). The user simply places the container in the appropriate configuration position, and manually rotates the container to select the start of the distribution of individual material categories, or the allocated capacity, the amount of allocation, or the execution speed of the allocated material, etc. The control does not require others to touch any shared surfaces (such as buttons) and can be used as distributed control to avoid touching surfaces that many people will touch to improve hygiene.

The technical features of the above embodiments can be combined arbitrarily. In order to make the description concise, not all possible combinations of the technical features in the above embodiments are described. However, as long as there is no contradiction in the combination of these technical features, they should be considered as the scope set forth in this specification.

The above embodiment only express a plurality of implementation manners of the present invention, and the description is relatively specific and detailed, but it should not be understood as a limitation on the scope of the invention patent. It should be pointed out that for those of ordinary skill in the art, without departing from the concept of this invention, a plurality of modifications and improvements can be made, and these all fall within the protection scope of this invention. Therefore, the scope of protection of the patent of this invention shall be subject to the appended claims.

What is claimed is:

1. A distribution control device, comprising: a rotation sensing assembly communicated with a logic control circuit configured to communicate with a distribution equipment the rotation sensing assembly is configured to detachably fix and match with a container; the rotation sensing assembly rotates along with the container;

wherein the rotation sensing assembly is configured to obtain and send a rotation information to the logic control circuit according to detection of rotation of the container from a starting position;

wherein the logic control circuit is configured to receive the rotation information and send a feeding control instruction to the distribution equipment according to the rotation information and a preset correspondence relationship; the feeding control instruction is configured to control the distribution equipment to transfer materials; when the logic control circuit detects that the container is turned back to the starting position, it sends a halt instruction to the distribution equipment according to the rotation information; the halt instruction is configured to control the distribution equipment to stop transferring the materials; wherein the preset corresponding relationship is a corresponding relationship between the rotation information and the feeding control instruction.

2. The distribution control device according to claim 1, wherein the rotation information comprises a rotation direction and/or a rotation amplitude; the feeding control instruction comprises a material temperature control instruction and/or a distribution speed control instruction; the logic control circuit is configured to send the material temperature control instruction to the distribution equipment according to the rotation direction and the preset corresponding relationship and/or the logic control circuit is configured to send the distribution speed control instruction to the distribution equipment according to the rotation amplitude and the preset corresponding relationship.

3. The distribution control device according to claim 1, wherein the rotation sensing assembly is detachably snapped on, detachably clamped on, or detachably adsorbed on the container.

4. The distribution control device according to claim 3, wherein grooves are provided on an inner surface of the rotation sensing assembly, and protrusions are provided on an outer surface of the container corresponding to the grooves on the inner surface of the rotation sensing assembly; or the protrusions are provided on the inner surface of the rotation sensing assembly, and the grooves are provided on the outer surface of the container corresponding to the protrusions on the inner surface of the rotation sensing assembly; or the protrusions and the grooves are provided on the inner surface of the rotation sensing assembly, and the grooves and the protrusions are provided on the outer surface of the container corresponding to the protrusions and the grooves on the inner surface of the rotation sensing assembly.

5. The distribution control device according to claim 1, wherein the rotation sensing assembly comprises a tray, a magnetic induction switch integrated circuit, and a magnet; the tray is configured to detachably fix the container; the magnet is arranged on the tray; the tray and the magnet rotate synchronously with the container; the magnetic induction switch integrated circuit is communicated with the logic control circuit the magnetic induction switch integrated circuit is configured to generate the rotation information and send the rotation information to the logic control circuit according to change of magnetic force induced when the magnet rotates.

6. The distribution control device according to claim 1 wherein the rotation sensing assembly comprises a tray, a current sensing integrated circuit, and a conductive element the tray is configured to detachably fix the container; the conductive element is arranged on the tray; the tray and the conductive element synchronously rotate with the container; the current sensing integrated circuit is communicated with the logic control circuit the current sensing integrated circuit is configured to generate the rotation information and send the rotation information to the logic control circuit according to current change induced when the conductive element rotates.

7. The distribution control device according to claim 1, wherein the rotation sensing assembly comprises a tray, a pressure-driven component and a piezoelectric sensing integrated circuit the tray is configured to detachably fix the container; the pressure-driven component is arranged on the tray; when the tray and the pressure-driven component synchronously rotate with the container to a certain position, the piezoelectric sensing integrated circuit communicates with the logic control circuit the piezoelectric sensing integrated circuit is configured to generate the rotation information and send the rotation information to the logic control circuit according to piezoelectric or current changes induced when the pressure-driven component rotates and is pressed down.

8. The distribution control device according to claim 1, wherein the rotation sensing assembly comprises a tray, a rotating component, and a circuit switch, the tray is configured to detachably fix the container; the rotating component is arranged on the tray; the tray and the rotating component synchronously rotate with the container; the circuit switch is communicated with the logic control circuit the circuit switch is configured to generate the rotation information and send the rotation information to the logic control circuit according to change of the circuit switch when the rotating component rotates.

9. A distribution device, comprising: a distribution equipment and the distribution control device according to claim 1; the distribution control device is communicated with the distribution equipment;
wherein the distribution equipment is configured for receiving the feeding control instruction, extracting and transferring the materials according to the feeding control instruction; and the distribution equipment is configured for receiving the halt instruction and stopping extracting the materials according to the halt instruction.

10. The distribution device according to claim 9, wherein distribution equipment comprises a material storage container and a feeding control device; the material storage container is communicated with the feeding control device; the feeding control device is communicated with the distribution control device;
wherein the feeding control device is configured to receive the feeding control instruction, extract and transfer the materials from the material storage container according to the feeding control instruction; the feeding control device is configured to receive the halt instruction and stop extracting the materials according to the halt instruction.

11. The distribution device according to claim 10, wherein the feeding control device comprises a pump; the material storage container is the liquid/semi-liquid material storage container; the distribution equipment further comprises the material conveying device; the liquid/semi-liquid material storage container is communicated with the pump by the material conveying device; the pump is communicated with the distribution control device.

12. The distribution device according to claim 11, wherein the feeding control device further comprises a flow detection device; the flow detection device is communicated with the distribution control device;
wherein the flow detection device is configured to detect flow of the materials and send the flow to the distribution control device;
wherein the distribution control device receives the flow, and when the distribution control device detects that the flow is inconsistent with a preset flow, the distribution control device sends a flow control instruction to the pump until the flow fed back by the flow detection device is consistent with the preset flow;
wherein the pump receives the flow control instruction and controls a dispensing speed according to the flow control instruction.

13. The distribution device according to claim 12, wherein the distribution device further comprises a temperature control device; the material conveying device is communicated with the flow detection device through the temperature control device;
wherein the pump receives the feeding control instruction, and controls the material conveying device according to the feeding control instruction to extract the materials from the liquid/semi-liquid material storage container and deliver the materials to the temperature control device;
wherein the temperature control device receives the materials and transmits the materials after controlling a temperature of the materials to a preset temperature.

14. The distribution device according to claim 10, wherein the feeding control device comprises a pump and a quantity distribution equipment, the material storage container comprises a liquid/semi-liquid material storage container and a solid material storage container; the distribution equipment further comprises a material conveying device; the liquid/semi-liquid material storage container is communicated with the pump through the material conveying device; the solid material storage container is communicated with the quantity distribution equipment; the pump and the quantity distribution equipment are communicated with the distribution control device.

15. The distribution device according to claim 10, wherein the feeding control device is a quantity distribution equipment, the material storage container is the solid material storage container; the solid material storage container is communicated with the distribution control device through the quantity distribution equipment.

* * * * *